(12) United States Patent
Asou

(10) Patent No.: US 6,415,404 B1
(45) Date of Patent: Jul. 2, 2002

(54) METHOD OF AN APPARATUS FOR DESIGNING TEST FACILE SEMICONDUCTOR INTEGRATED CIRCUIT

(75) Inventor: Masao Asou, Kanagawa (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/384,950

(22) Filed: Aug. 27, 1999

(30) Foreign Application Priority Data

Sep. 10, 1998 (JP) .......................................... 10-256960

(51) Int. Cl.⁷ .............................................. G01R 31/28
(52) U.S. Cl. ........................ 714/726; 714/729; 716/4; 716/6; 716/12; 716/18
(58) Field of Search ................................ 714/724, 725, 714/726, 727, 729; 716/4, 6, 12, 18

(56) References Cited

U.S. PATENT DOCUMENTS

| 5,502,647 A | 3/1996 | Chakradhar et al. ............ 716/4 |
| 5,680,406 A | * 10/1997 | Nakamura .................. 714/724 |
| 5,696,771 A | 12/1997 | Beausang et al. ............ 714/726 |
| 5,928,374 A | * 7/1999 | Shimizu et al. ............. 714/724 |
| 6,199,183 B1 | * 3/2001 | Nadaoka ..................... 714/726 |

FOREIGN PATENT DOCUMENTS

| JP | 1-80884 | 3/1989 | ........... G01R/31/28 |
| JP | 1-302850 | 12/1989 | ........... H01L/27/04 |
| JP | 2-282836 | 11/1990 | ........... G06F/11/22 |
| JP | 3-59475 | 3/1991 | ........... G01R/31/28 |
| JP | 4-172266 | 6/1992 | ........... G01R/31/28 |

* cited by examiner

Primary Examiner—Emmanuel L. Moise
(74) Attorney, Agent, or Firm—Hayes Soloway P.C.

(57) ABSTRACT

In a method of designing a test facile semiconductor integrated circuit with scan paths, a method of designing an optimum assigning arrangement of scan paths. For minimizing an area of interconnection wiring of scan paths among the logic blocks, the average number of flip-flops to be subjected to a scan path test, expressed another word as a scan path length, is calculated at first. Combinations and division of the logic blocks on which a scan path is assigned are calculated for all number of scan paths. Wiring length of interconnection among the logic blocks for each assigning combination of total scan paths is calculated to select the shortest wiring length interconnection among logic blocks as the optimal scan paths assigning arrangement.

20 Claims, 11 Drawing Sheets

METHOD OF AN APPARATUS FOR DESIGNING TEST FACILE SEMICONDUCTOR INTEGRATED CIRCUIT

BACKGROUND OF THE INVENTION

1. Field of the Invention

The present invention relates to a method of and an apparatus for designing a test facile semiconductor integrated circuit with scan paths, and more particularly to a method of designing a scan path construction of a test facile semiconductor integrated circuit with scan paths.

2. Description of the Related Art

A known technique for applying a scan path test to a semiconductor integrated circuit which is divided into logic blocks will be described below with reference to FIG. 1 of the accompanying drawings.

As shown in FIG. 1, a semiconductor integrated circuit is divided into logic blocks A, B, C, D. If five scan paths are to be employed, then the five scan paths are incorporated in each of the logic blocks, and the scan paths in the logic blocks are interconnected in a highest layer. According to this technique, the numbers of scan paths in the logic blocks are equal to each other, but the area of interconnections used is large because as many interconnections as the number of divided scan paths extend between adjacent ones of the logic blocks. Details of this scan path technique are disclosed in Japanese laid-open patent publication No. 01-302850.

According to the disclosure, after layout and interconnection processes in the logic blocks are finished, the scan paths are constructed such that one scan path passes once through each logic block without passing a plurality of times through each logic block. In this example, the scan paths are constructed such that each divided scan path passes once through each logic block. Since the same number of scan paths are constructed in all the logic blocks, the area of interconnections between adjacent ones of the logic blocks is large.

Based on layout information of flip-flops (FFs) in the scan paths, the order of the FFs in the scan paths is changed for optimum connection in order to connect adjacent FFs.

According to Japanese laid-open patent publication No. 01-080884, a circuit is divided for advantageous test pattern generation, and scan paths are constructed from the circuit division information.

Japanese laid-open patent publication No. 02-282836 discloses an invention relating to the control of shifting operation. Japanese laid-open patent publications Nos. 03-059475 and 04-172266 reveal inventions relating to the technique of a method of controlling shifting operation.

According to another known process of designing a large-scale semiconductor integrated circuit, the circuit is divided into a plurality of logic blocks, a highest layer representing connection information between the logic blocks and an internal structure of each logic block are designed separately from each other, and thereafter their design data are combined with each other. There is also known a scan path test for large-scale semiconductor integrated circuits designed for testability. According to the scan path test, in order to control and observe the states of FFs in the circuit directly from outside of the circuit, all the FFs in the circuit are connected in series with each other into a shift register for facilitating the generation of a test pattern.

A period of time required by the scan path test increases in proportion to the length of the shift register constructed in the scan path test. The scan path test time can be reduced by a process of constructing a scan path such that the scan path is divided into a plurality of scan paths thereby to shorten each of the scan paths. Since the time to test the longest one of the divided scan paths becomes the time to test the semiconductor integrated circuit, the scan path needs to be divided into as equal scan paths as possible.

SUMMARY OF THE INVENTION

It is an object of the present invention to provide a method of designing a scan path construction of a test facile semiconductor integrated circuit with scan paths to determine the construction of scan paths assigned to logic blocks so as to minimize the overall length of interconnections between the logic blocks, from the number of scan paths, layout information of each of the logic blocks, and the number of FFs to be subjected to a scan path test within each of the logic blocks.

To achieve the object described above, there is provided in accordance with the present invention a method of designing a test facile semiconductor integrated circuit with scan paths, comprising the steps of counting the number of flip-flops to be subjected to a scan path test in each of logic blocks, calculating an average number of flip-flops per scan path from the number of scan paths and the overall number of flip-flops in the semiconductor integrated circuit, reading pin layout information and floor plan information of each of the logic blocks, assigning a scan path to the logical blocks from a selected logic block serving as a start point, repeating the step of assigning a scan path to the logical blocks, and determining a scan path assigning arrangement in which the overall length of interconnections between the logic blocks is shortest, from the result of the division of scan paths.

If a fraction is produced when the average number of flip-flops per scan path is calculated from the number of scan paths and the overall number of flip-flops in the semiconductor integrated circuit, then the number of flip-flops which is counted as residual of the division is preferably assigned one by one to the number of scan paths.

If a scan path of an equal length cannot be constructed in one logic block in the step of assigning a scan path to the logic blocks from a selected logic block serving as a start point, then flip-flops in shortage are preferably supplied from the next logic block for thereby constructing a scan path.

The step of repeating the step of assigning a scan path to the logic blocks from selected logic block serving as a start point, a scan path for all combinations of logic blocks preferably comprises the step of repeating the step of assigning a scan path for only combined adjacent logic blocks.

The method may further comprise the step of constructing a single scan path so as not to extend over a plurality of logic blocks as much as possible to determine a shortest expected length of interconnections between the logic blocks, in order to achieve a scan path division arrangement to minimize an area of interconnections between the logic blocks from the result of the division of scan paths.

The step of calculating an average number of flip-flops per scan path from the number of scan paths and the overall number of flip-flops in the semiconductor integrated circuit may be replaced with the step of, if it is necessary to equalize the numbers of flip-flops contained in divided scan paths in the logic blocks, coupling the logic blocks in a combination capable of equalize the numbers of flip-flops contained in the divided scan paths.

According to the present invention, there is also provided an apparatus for designing a scan path construction of a test facile semiconductor integrated circuit with scan paths, comprising means for counting the number of flip-flops to be subjected to a scan path in each of logic blocks, means for calculating an average number of flip-flops per scan path from the number of scan paths and the overall number of flip-flops in the semiconductor integrated circuit, means for reading pin layout information and floor plan information of each of the logic blocks, means for assigning a scan path in a combination of logic blocks from a selected logic block serving as a start point and another logic block, means for repeating the assigning of a scan path for all combinations of logic blocks, and means for determining a scan path assignment arrangement in which the overall length of interconnections between the logic blocks is shortest, from the result of the assignment of scan paths.

According to the present invention, there is further provided a recording medium which stores a control program for a method of designing a scan path construction of a test facile semiconductor integrated circuit with scan paths to determine assigned scan paths to minimize an area occupied with interconnection wiring among logic blocks due to the scan paths assigned to logic blocks, wherein the control program comprising the steps of counting the number of flip-flops to be subjected to a scan path in each of logic blocks, calculating an average number of flip-flops per scan path from the number of scan paths and the overall number of flip-flops in the semiconductor integrated circuit, reading pin layout information and floor plan information of each of the logic blocks, assigning a scan path to the logic blocks from a selected logic block serving as a start point in each combination of logic blocks, repeating the step of assigning a scan path for all combinations of logic blocks, and determining a scan path assigning arrangement in which the overall length of interconnections between the logic blocks is shortest, from the result of the division of scan paths.

The above and other objects, features, and advantages of the present invention will become apparent from the following description with reference to the accompanying drawings which illustrate examples of the present invention.

DESCRIPTION OF THE PREFERRED EMBODIMENTS

Figure 1:
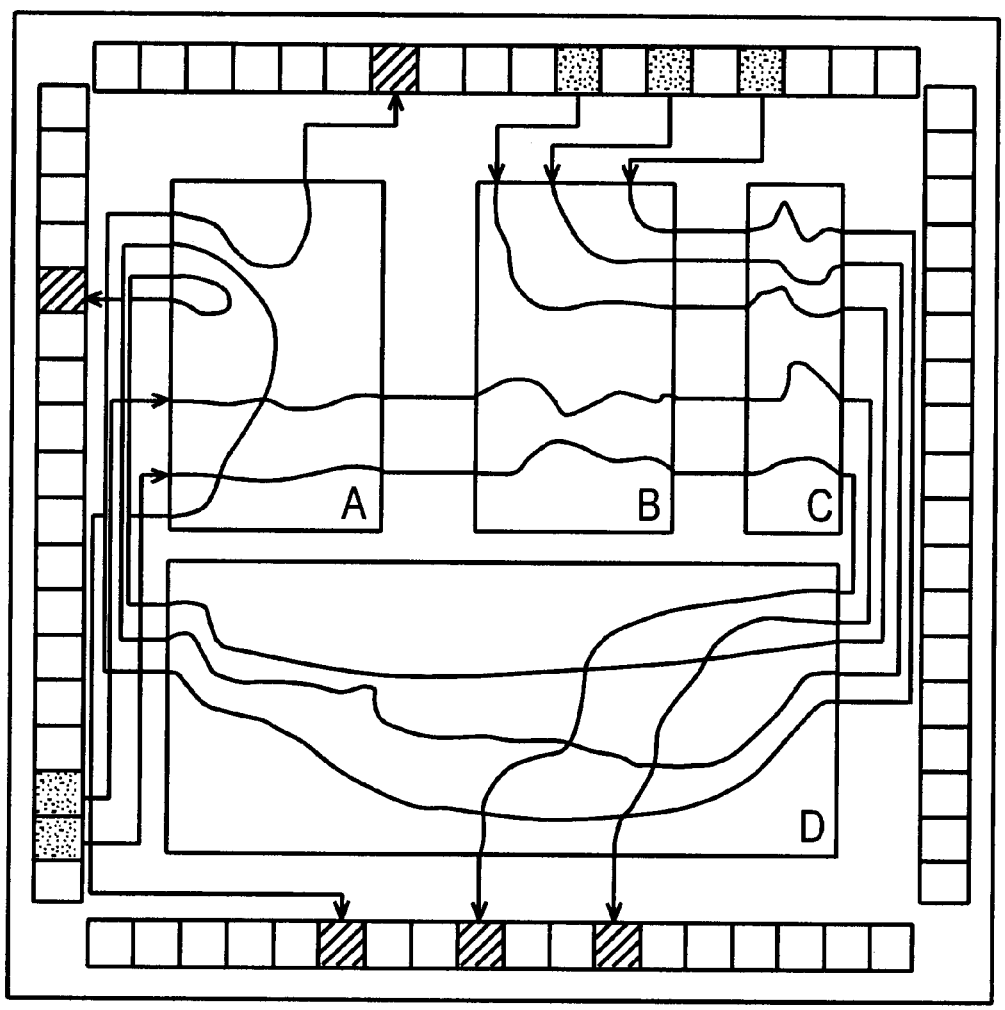
FIG. 1 is a diagram showing the path chart of a conventional scan path test applied to a process of designing a semiconductor integrated circuit.
Figure 2:
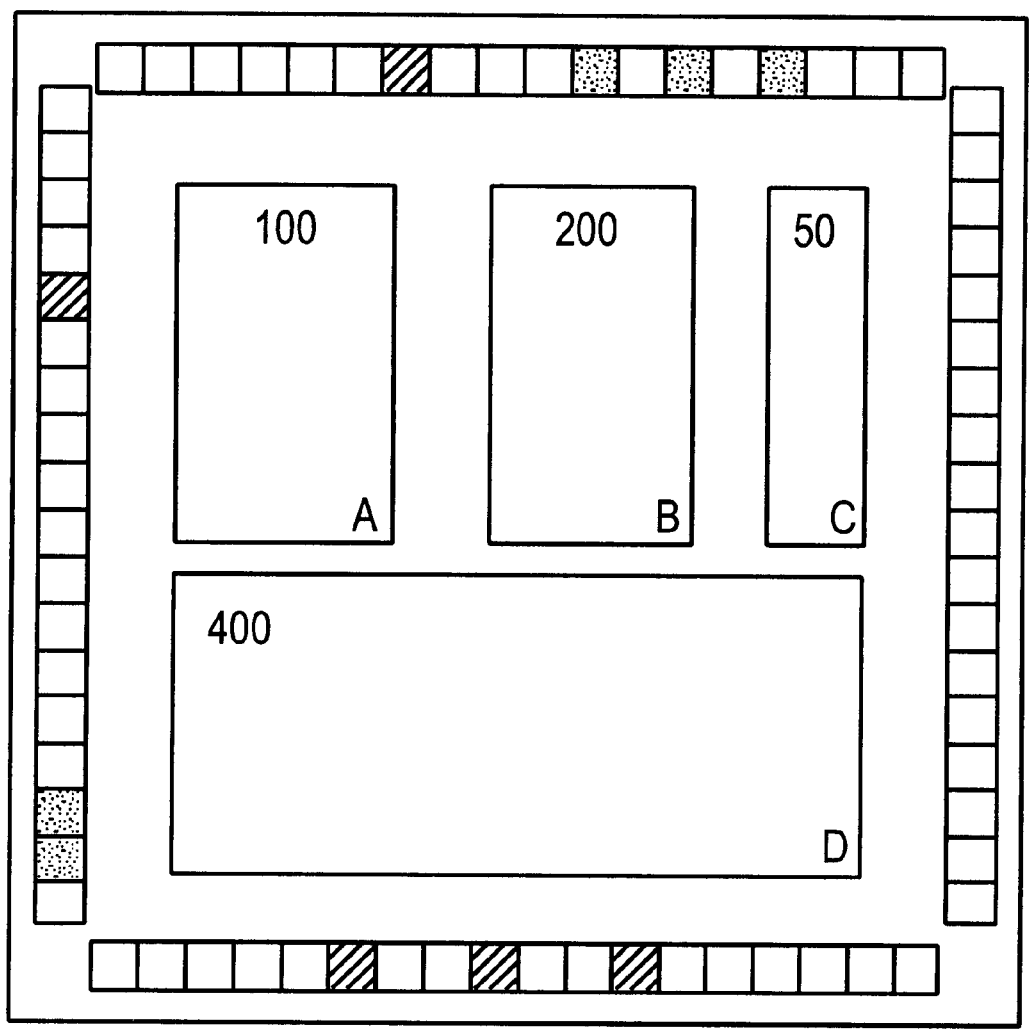
FIG. 2 is a diagram showing the layout of a semiconductor integrated circuit to be designed according to the present invention.

FIG. 2 schematically shows the layout of a semiconductor integrated circuit to be designed according to the present invention.

The present invention is concerned with a method of designing a test facile semiconductor integrated circuit with scan paths to determine the number of divided scan paths assigned to logic blocks so as to minimize the overall length of interconnections between the logic blocks, from the number of scan paths, layout information of each of the logic blocks, and the number of FFs to be subjected to a scan path test within each of the logic blocks.

A period of time required by a scan path test conducted on a test facile semiconductor integrated circuit is shorter as the number of scan paths is larger and the number of semiconductors to be examined by one scan path is fewer, i.e., the scan paths are shorter. However, the number of divided scan paths should be kept within a certain range because there is a certain limitation on the number of pins available for the scan path test.

The floor plan information of each of the logic blocks is established with respect to the lowest left position (0, 0) and the highest right position (100, 100) of an LSI board.

The semiconductor integrated circuit shown in FIG. 2 will be described below. As shown in FIG. 2, the semiconductor integrated circuit comprises a logic block A having 100 FFs, a logic block B having 200 FFs, a logic block C having 50 FFs, and a logic block D having 400 FFs. Therefore, the number of FFs to be subjected to a scan path test in the semiconductor integrated circuit is 750. If five scan paths are employed in the semiconductor integrated circuit, then the average number of FFs assigned to a scan path, also referred to as a scan path length, is 150.

In FIG. 2, the number of scan paths in each of the logic blocks is determined such that 150 FFs, i.e., to make up 5 scan paths having the average 150 FFs in the group of the logic blocks A, B, C, D assigning from the block A sequencialy.

Since the scan paths are constructed such that a single scan path does-not extend over a plurality of logic blocks as much as possible, the scan path interconnection between adjacent ones of the logic blocks is minimized, preventing the area of interconnections from being increased due to the division of scan paths.

Figure 3:
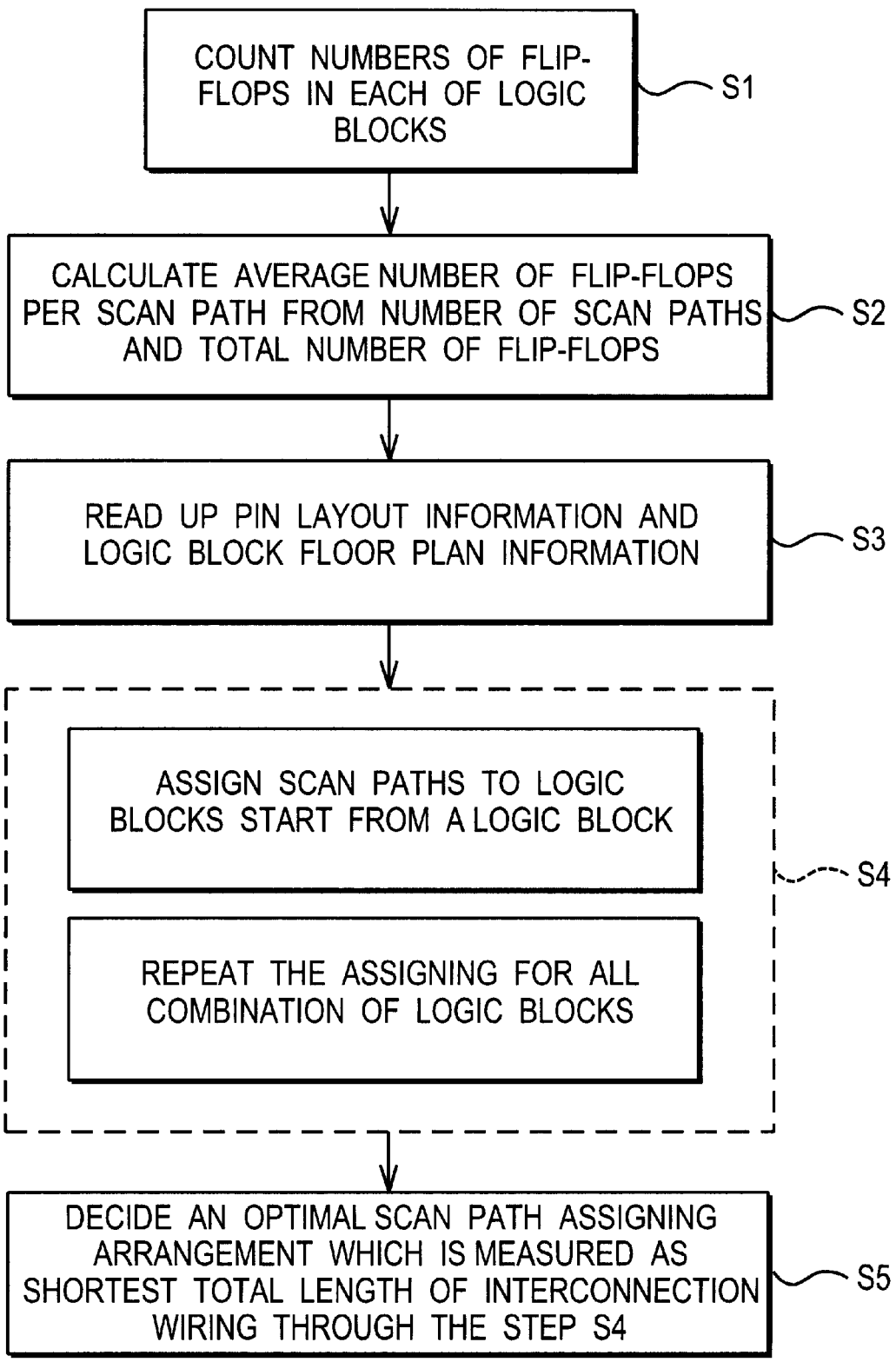
FIG. 3 is a flowchart of a method of designing a test facile semiconductor integrated circuit according to the present invention.

FIG. 3 is a flowchart of a process of assigning the scan paths to the logic blocks.

First, the number of FFs in each of the logic blocks is counted (step S1). The number of divided scan paths is calculated and the average number of FFs to be connected per scan path is calculated from the total number of FFs in the semiconductor integrated circuit in (step S2).

Then, temporary layout information of the logic blocks is read (step S3). The adjacency relationship between the logic blocks is determined, and combinations of connection relationships of the logic blocks are examined.

For example, the following connection relationships of the logic blocks are available in the semiconductor integrated circuit shown in FIG. 2:

A-B-C-D
B-C-D-A
C-D-A-B
D-A-B-C
A-D-B-C
A-D-C-B
A-B-D-C
C-D-B-A
C-B-D-A

From the examined connection relationships, scan paths are assigned to achieve scan paths of equal lengths (including equal numbers of FFs) from the logic block A which serves as a start point (step S4). If a scan path of an equal length cannot be constructed in one logic block, then FFs in shortage are supplied from the next logic block for thereby constructing a scan path.

Finally, the assigning of scan paths in the logic blocks, which makes shortest the overall length of interconnections between the logic blocks if the assigned scan paths in the logic blocks in the above combinations of the connection relationships are connected, is determined as the scan path assigning arrangement for the semiconductor integrated circuit shown in FIG. 2 (step S5).

A process of constructing five scan paths in the semiconductor integrated circuit shown in FIG. 2 will be described below.

The number of FFs to be examined by a scan path test is 750, and assuming five scan paths are constructed, then the average umber of assigned FFs (average length of scan path) is equivalent to 150.

Figure 4:
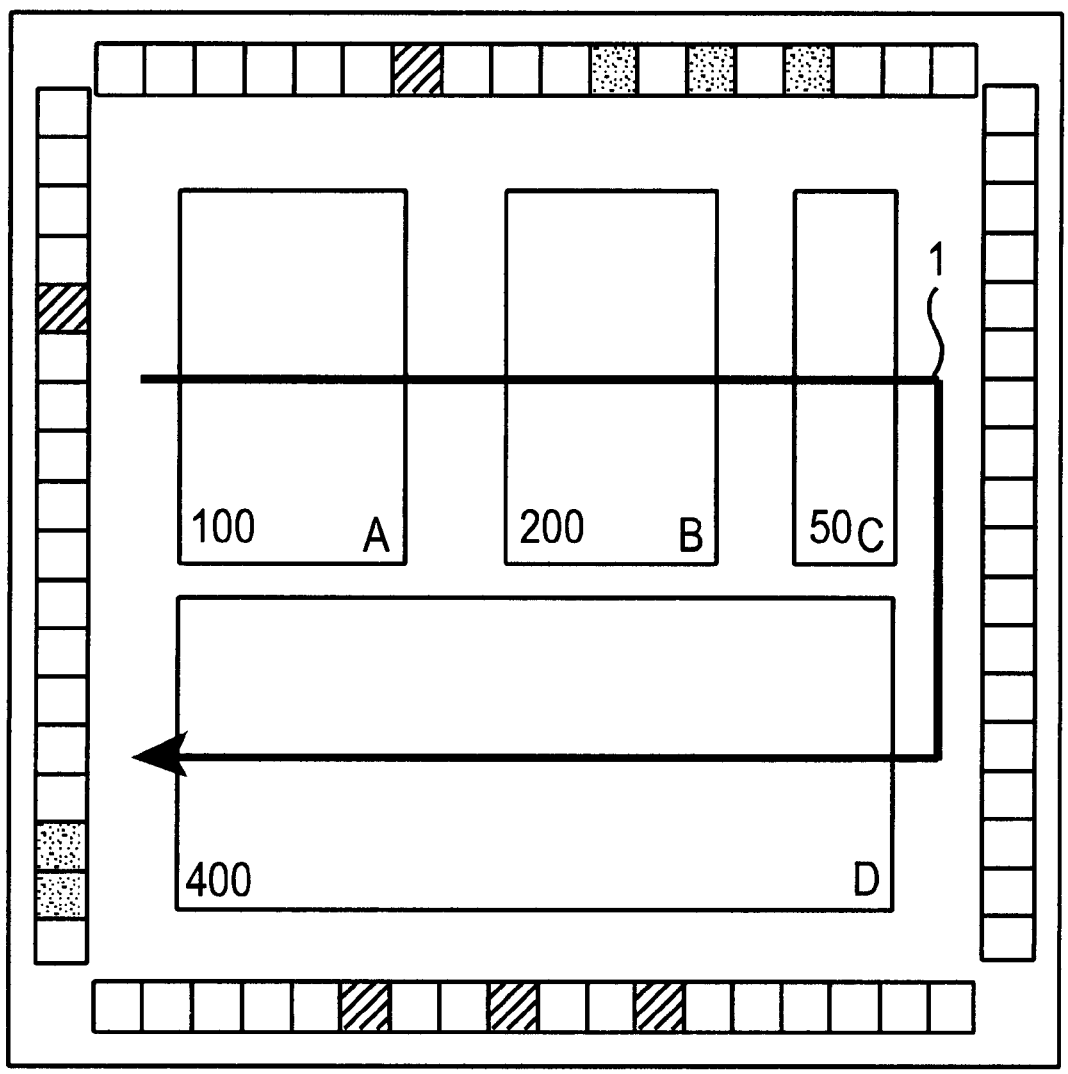
FIG. 4 is a diagram showing an example of assigning scan paths in the semiconductor integrated circuit according to the present invention.

In FIG. 4, the arrow 1 indicates a sequence of logic blocks to which scan paths are assigned. In the example shown in FIG. 4, scan paths each equivalent to 150 FFs are constructed successively in the sequence of the logic blocks A, B, C, D.

Figure 5:
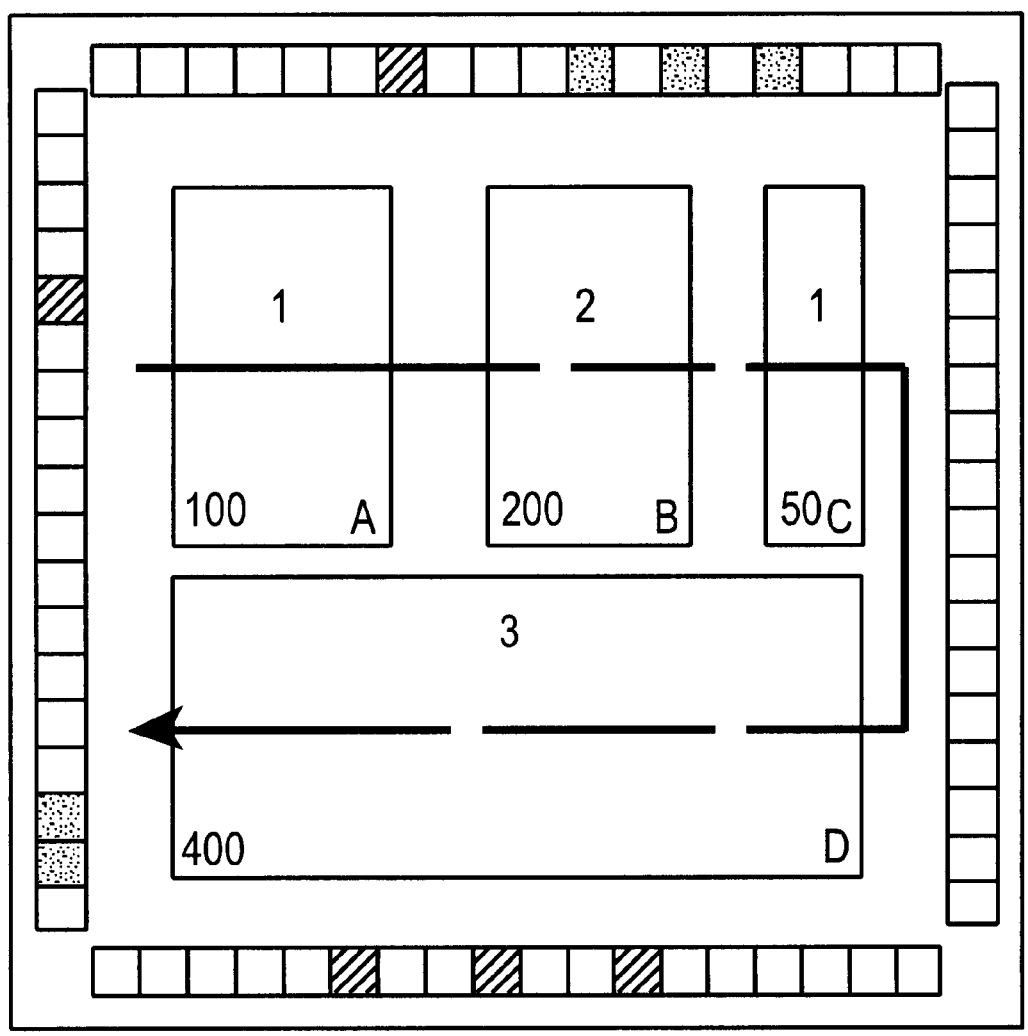
FIG. 5 is a diagram showing the numbers of assigned scan paths to logic blocks in the semiconductor integrated circuit.

In FIG. 5, the logic block A has 100 FFs, which are less than 150 FFs that represent the average length of divided scan paths. In this case, 50 FFs from the logic block B are supplied, and a single scan path extending over the logic blocks A, B is constructed of the 100 FFs in the logic block A and the supplied 50 FFs in the logic block B. The logic block B has 200 FFs, from which 50 FFs have been used to construct the scan path of the logic block A. Therefore, a first scan path is constructed as a second scan path with remaining 150 FFs in the logic block B. This scan path is complete by itself in the logic block B, and does not extend into other logic blocks.

Since the logic block C has 50 FFs, it has to be supplied 100 FFs from the logic block D, and these FFs jointly make up a third scan path by extending into the logic block D.

The logic block D has remaining 300 FFs available for constructing scan paths because 100 FFs are supplied for logic block C to construct the third scan path.

Therefore, two scan paths are assigned for the remaining 300 FFs in the logic block D. These two scan paths fourth and fifth are completed by themselves within the logic block D.

As a result, the number of scan paths are assigned as the first scan path to logic block A and part of B, the second scan path to the remains of logic block B, the third scan path to logic block C and a part of logic block D, and the fourth and fifth scan paths are assigned to the remains of logic block D.

Figure 6:
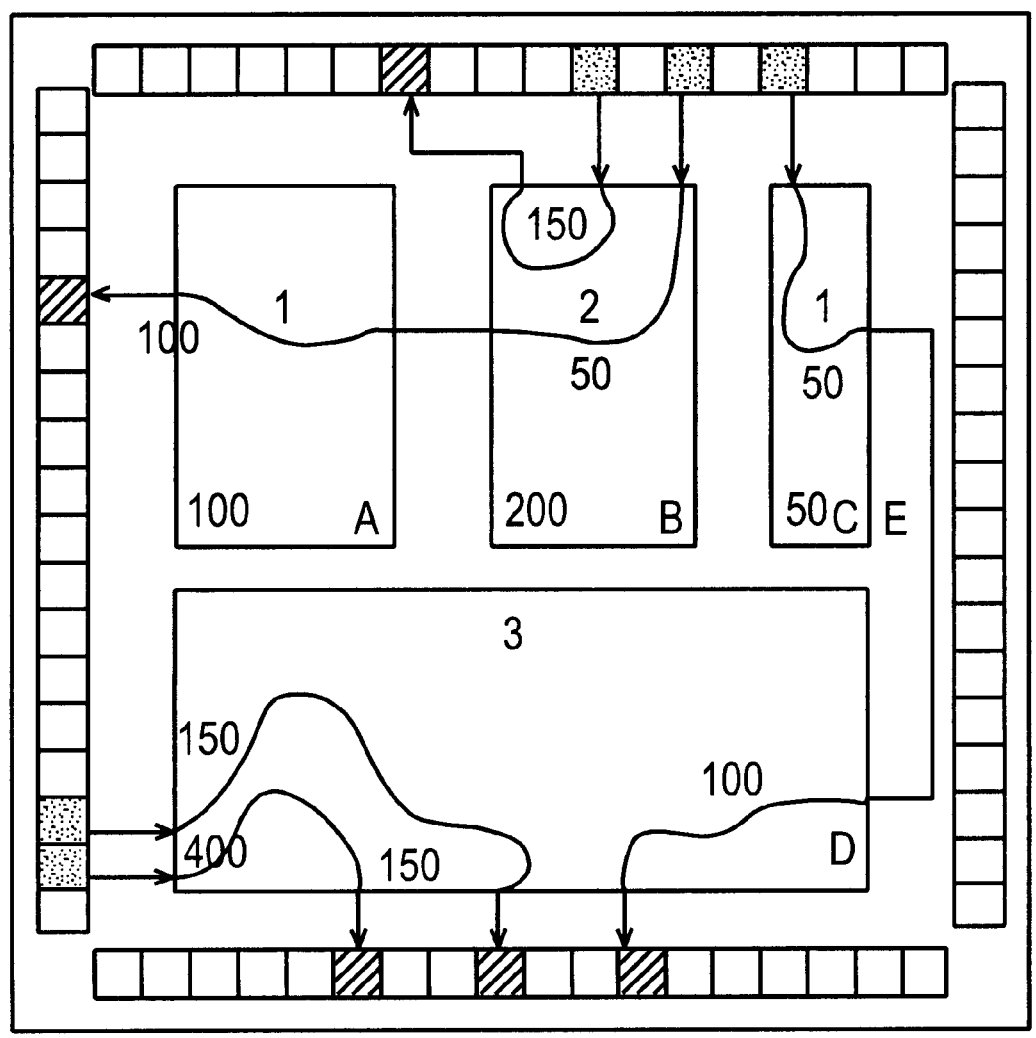
FIG. 6 is a diagram of a first embodiment of the present invention showing the logic blocks whose assigned scan paths shown in FIG. 5 are interconnected in an higher layer.

FIG. 6 shows a first embodiment of the present invention with the manner in which scan paths are constructed in the logic blocks with the numbers of scan paths shown in FIG. 5, and the scan paths in the logic blocks are interconnected in a higher layer E.

In the example shown in FIG. 6, a single interconnection is created between the logic blocks A, B, and a single interconnection is created between the logic blocks C, D.

Figure 7:
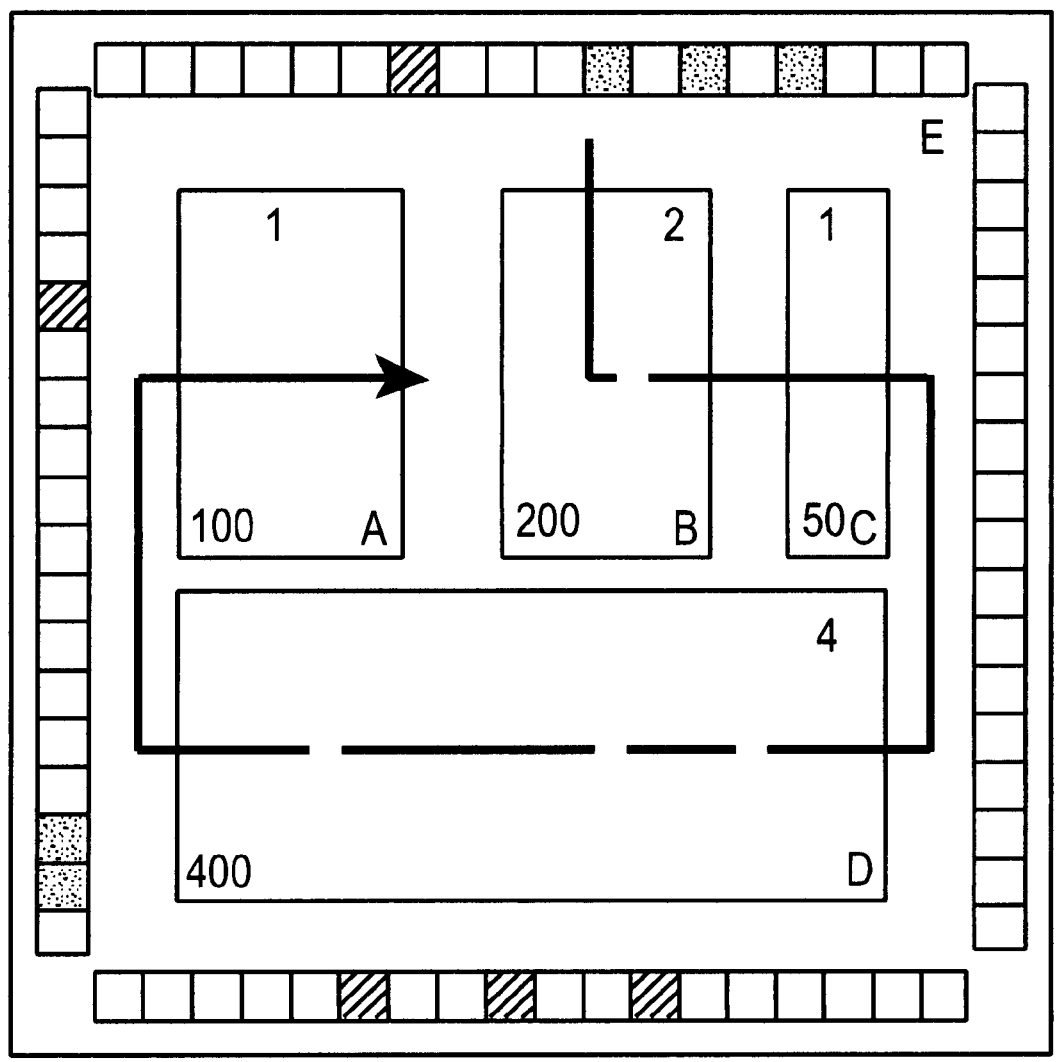
FIG. 7 is a diagram showing another plan of assigning scan paths in the semiconductor integrated circuit according to the present invention.

FIG. 7 shows the manner in which scan paths are assigned successively in a sequence of the logic blocks B, C, D, A as a second embodiment of this invention.

In FIG. 7, since the logic block B has 200 FFs, a first scan path is constructed of 150 FFs in the logic block B. The remaining 50 FFs in the logic block B are supplied to make up for 50 FFs in the next logic block C. However, inasmuch as the sum of these FFs does not reach 150 FFs which is the average number of FFs per scan path, another 50 FFs are supplied from the logic block D to construct a second scan path that extends over the logic blocks B, C, D. Then, 350 FFs are available in the logic block D, and 300 out of these 350 FFs are used to construct a third and a fourth scan paths in the logic block D. Remaining 50 FFs in the logic block D are supplied for logic block A having 100 FFs to construct a fifth scan path, extending over the logic blocks from D to A. In the sequence shown in FIG. 7, therefore, a scan path covers logic block A, two scan paths relate in the logic block B, one scan path covers logic block C, and four scan paths relate in the logic block D.

Figure 8:
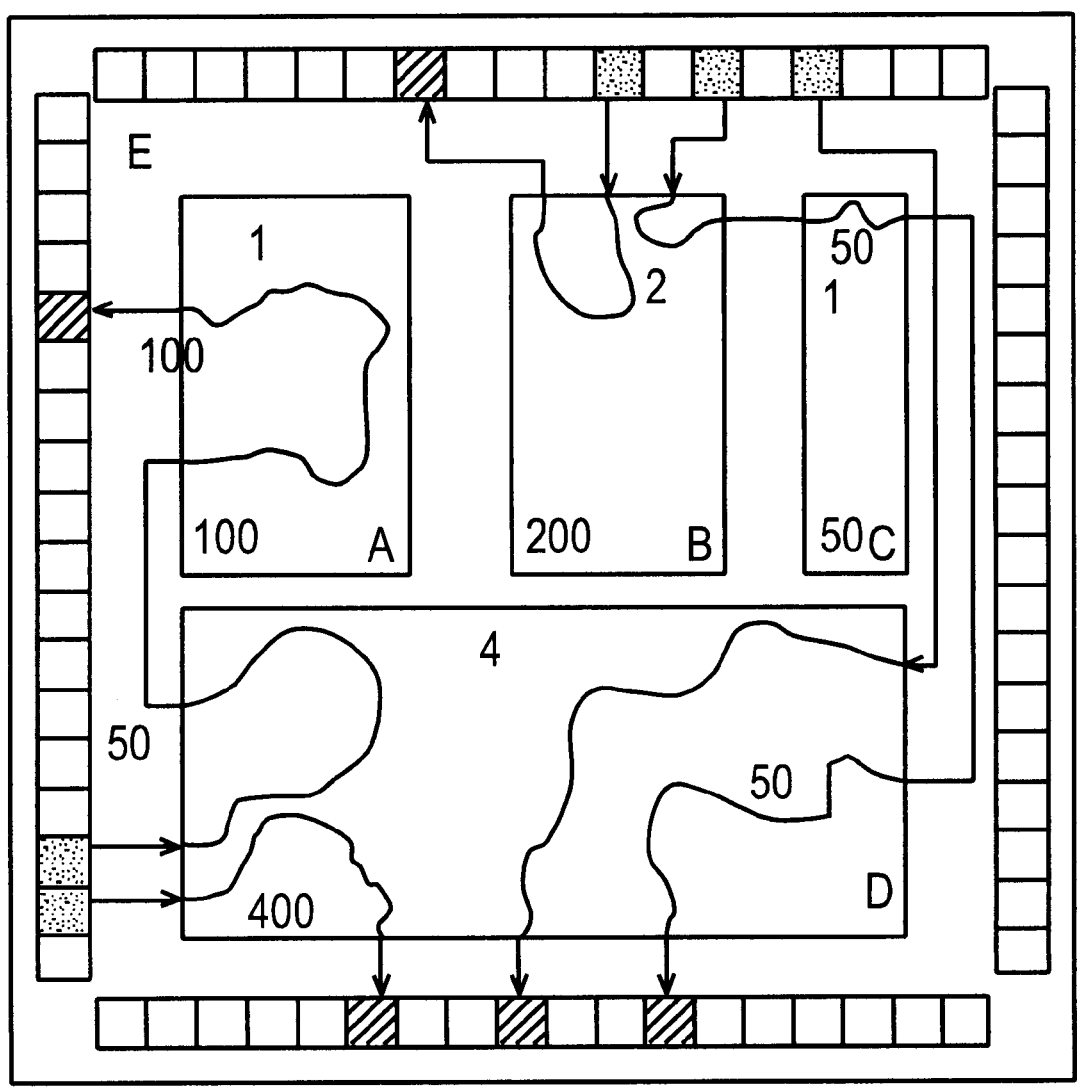
FIG. 8 is a diagram of a second embodiment showing the logic blocks whose assigned scan paths shown in FIG. 7 are interconnected in an higher layer.

FIG. 8 shows second embodiment designed by the present invention with the manner in which scan paths are constructed in the logic blocks with the numbers of scan paths shown in FIG. 7, and the scan paths in the logic blocks are interconnected in a higher layer E. In the example shown in FIG. 8, interconnections between scan paths are necessary between logic blocks D and A, logic blocks B and C, and logic blocks C and D.

A comparison between the scan path assigning schemes shown in FIGS. 5 and 7 indicates that the number of interconnections between logic blocks is smaller with the numbers of scan paths shown in FIG. 5 than with the numbers of scan paths shown in FIG. 7.

Consequently, if five scan paths are constructed in the semiconductor integrated circuit shown in FIG. 2, then the numbers of scan paths in the logic blocks and the number of interconnections between the logic blocks as shown in FIG. 5 represent a combination which is most effective in reducing the area of interconnections between the logic blocks.

Figure 12:
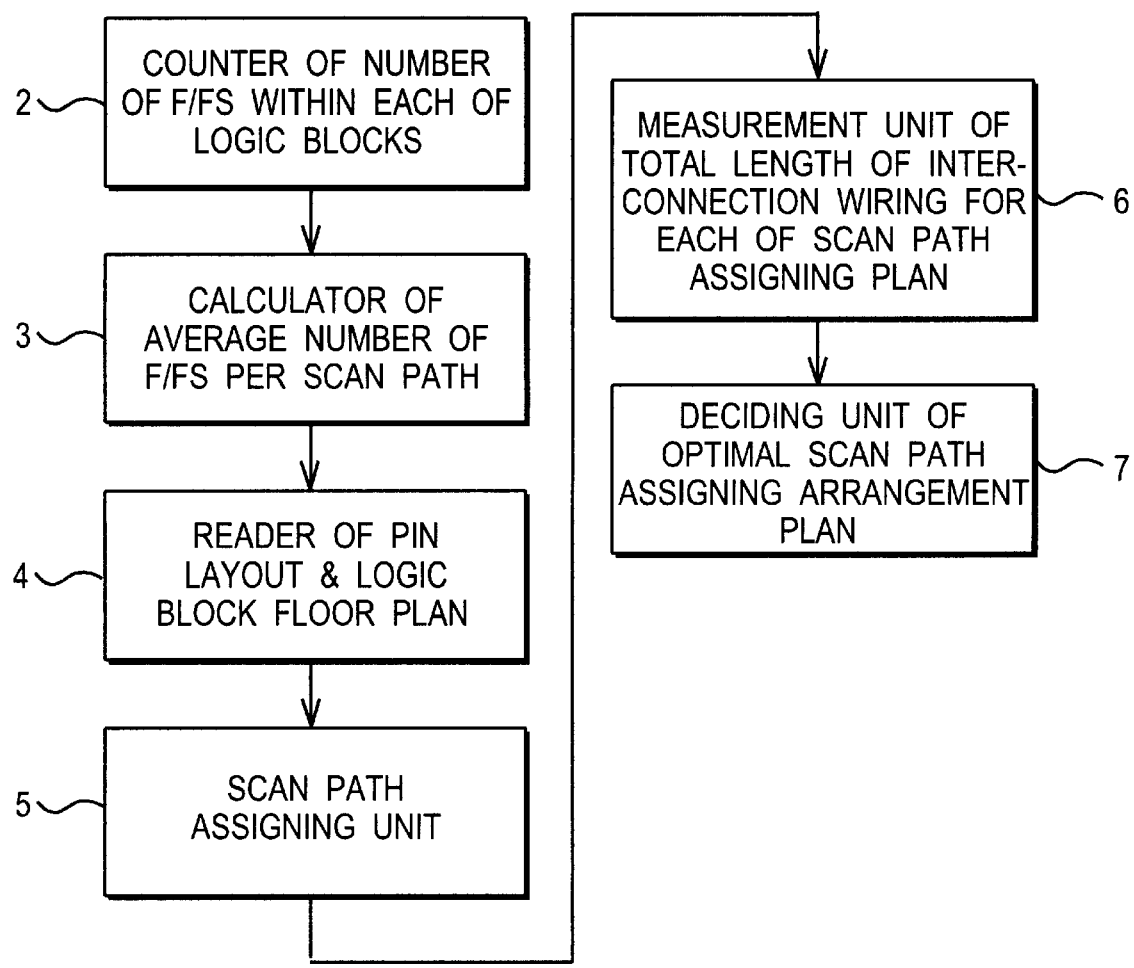
FIG. 12 is a block diagram of an apparatus which carries out the method of designing a test facile semiconductor integrated circuit according to the present invention.

FIG. 12 shows in block form an apparatus which carries out the method of designing a test facile semiconductor integrated circuit according to the present invention. As shown in FIG. 12, the apparatus comprises an FF counter 2 for counting number of FFs in each of the logic blocks, a scan path length calculator 3 for calculating a scan path length represented by an average number of FFs to be tested per scan path from the number of divided scan paths and the total number of FFs in the semiconductor integrated circuit, a layout reader 4 for reading a floor plan of pin layout and logic blocks, a scan path assigning unit 5 for planning of assigning scan paths for all combination of logic blocks, a measuring unit 6 for measuring the overall lengths of interconnections between logic blocks based on the result of planning of scan path assigning unit 5, and a determining unit 7 for determining an optimal scan path assigning plan.

When the numbers of FFs in the logic blocks are supplied to the FF counter 2, the scan path length calculator 3 calculates a scan path length from the supplied number of scan paths and an output signal from the FF counter 2. The layout reader 4 reads a floor plan of pin layout and logic blocks which are supplied, and produces a plan of a layout for the semiconductor integrated circuit. The scan path assigning unit 5 calculates combinations of logic blocks, determines assigned scan paths starting from each logic block for the calculated combinations of logic blocks, and records the results of all scan paths assigned plan for each of the combinations. The measuring unit 6 measures the overall lengths of interconnections between logic blocks based on the result of scan paths assigned plan. The determining unit 7 compares the combinations of logic blocks, selects a combination in which the overall length of interconnections between logic blocks is shortest, and outputs the selected shortest interconnection length combination plan as the optimal scan path, plan.

A method, according to a third embodiment of the present invention, of assigning scan paths of equal lengths disposed in logic blocks or extending into other logic blocks and constructing a number of scan paths so as to minimize the area of interconnections between the logic blocks in order to avoid a scan path extending over a plurality of logic blocks as much as possible, will be described below.

In the above embodiment, the lengths of scan paths assigned in the logic circuits are not necessarily equal to each other. However, there is a situation where the lengths of scan paths assigned in the logic circuits need to be equal to each other due to limitations imposed by an integrated circuit CAD (Computer-Aided Design) tool which is used. The method according to the third embodiment is applicable to such a situation.

In the semiconductor integrated circuit shown in FIG. 2, the logic blocks are combined in a possible combination, the assigning of scan paths over the logic blocks for each of the combinations is determined, and each total length of the interconnections of the logic blocks for all combinations are measured.

A combination in which the logic blocks A and B are coupled and the logic blocks C and D are coupled in FIG. 2 will be described below.

If the logic blocks A and B are coupled, then the total number of FFs in the coupled logic blocks A and B is 300. Dividing the 300 FFs by the average number of FFs, i.e., 150, per scan path results in two scan paths. In this case, two scan paths are assigned in each of the logic blocks A and B in parallel, and the scan paths in the logic blocks A and B are interconnected.

Figure 9:
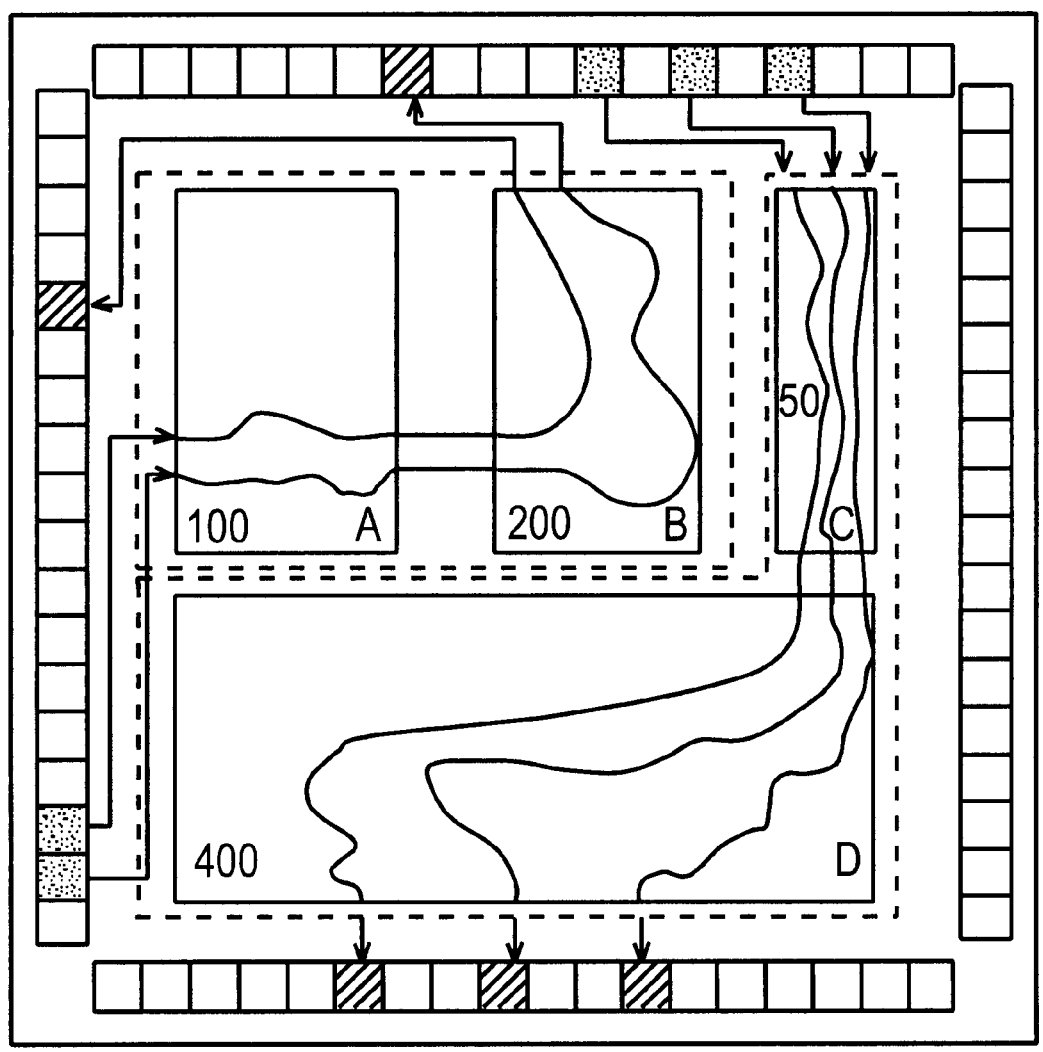
FIG. 9 is a diagram of a third embodiment of the present invention showing a combination of scan paths constructed by a method of designing a test facile semiconductor integrated circuit.

If the logic blocks C and D are coupled, then the total number of FFs in the coupled logic blocks C and D is 450. Dividing the 450 FFs by the average number of FFs, i.e., 150, per scan path results in three scan paths. In this case, three scan paths are assigned in each of the logic blocks C and D in parallel and the scan paths in the logic blocks C and D are interconnected. The connected scan paths are shown in FIG. 9.

Another combination in which the logic blocks A and C are coupled and the logic blocks B and D are coupled in FIG. 2 will be described below.

Figure 10:
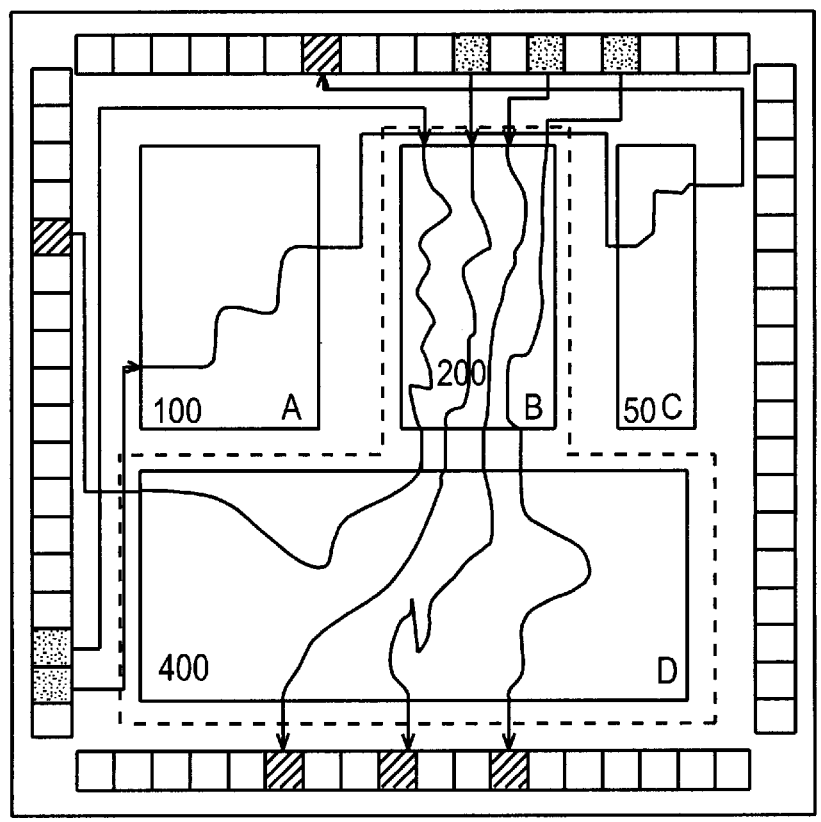
FIG. 10 is a diagram of a fourth embodiment of the present invention showing another arrangement of scan paths.
Figure 11:
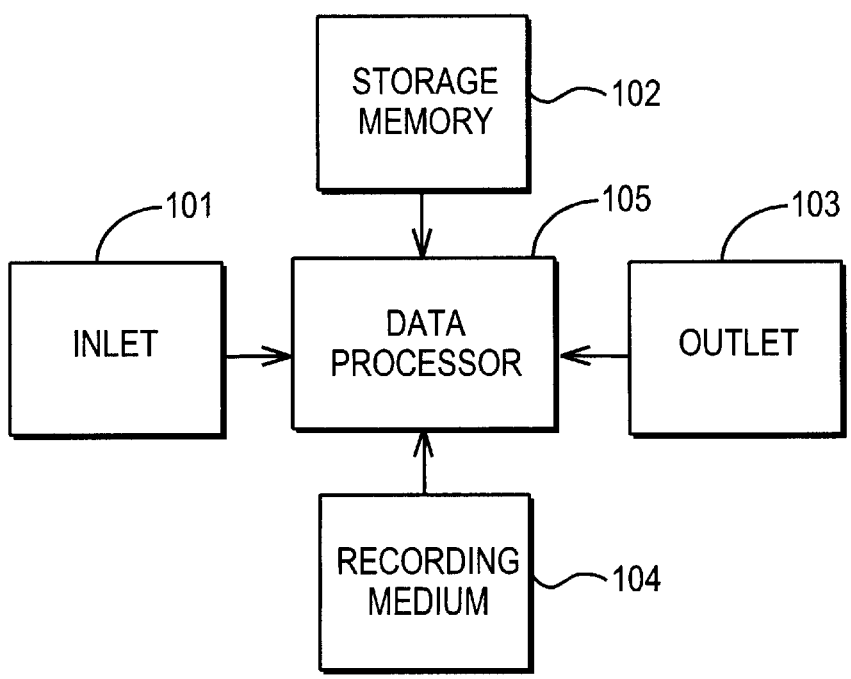
FIG. 11 is a block diagram of an apparatus which carries out the method of designing a test facile semiconductor integrated circuit according to the present invention.

As shown in FIG. 10, a fourth embodiment designed by the present invention in which a scan path is constructed in each of the logic blocks A and C, and four scan paths are assigned in each of the logic blocks B and D in parallel. The scan paths in the logic blocks A and C are connected to each other by one interconnected scan path, and the scan paths in the logic blocks B and D are connected to each other by four interconnected scan paths. Since the number of scan paths shown in FIG. 9 results in a smaller area of interconnections between the logic blocks, two scan paths are assigned in each of the logic blocks A and B in parallel, and the scan paths in the logic blocks A and B are interconnected, and three divided scan paths are assigned in each of the logic blocks C and D in parallel, and the scan paths in the logic blocks C and D are interconnected.

In the above process of calculating the average number of FFs per scan path, the overall number of FFs in the semiconductor integrated circuit is exactly divisible by the number of scan paths in each of the above embodiments. If a fraction is produced when the average number of FFs per scan path is calculated, then the remainder FFs shall be assigned one by one to the number of divided scan paths. Such a process will be described below.

Presuming the number of scan paths is 16 and the overall number of FFs is 22,500, then the scan path lengths are represented by (1,406 FFs/scan path)×(12 scan paths) and (1,407 FFs/scan path)×(4 scan paths).

Then, a control program is read from recording medium 104 into data processor 105, and controls the operation of data processor 105. Data processor 105 which is controlled by the control program performs the following processing steps of:

counting the number of FFs to be subjected to a scan path test in each of logic blocks;

calculating an average number of FFs per scan path from the number of scan paths and the overall number of FFs in a semiconductor integrated circuit;

reading pin layout information and floor plan information of each of the logic blocks;

assigning the scan paths to the logic blocks from a selected logic block serving as a start point;

repeating the step of assigning the scan paths for all logic blocks serving as start points; and determining a scan path assigning arrangement in which the overall length of interconnections between the logic blocks is shortest, from the result of the assigning of scan paths.

It can readily be understood that the above steps can be software-implemented by the control program recorded in recording medium 104.

As described above, it has heretofore been customary to construct equal numbers of assigned scan paths of equal lengths in respective logic blocks and interconnect the scan paths through all the logic blocks.

Such a conventional arrangement is disadvantageous in that many interconnections are necessary to interconnect the scan paths through all the logic blocks.

According to the present invention, however, the each of scan paths in logic blocks is determined such that any scan paths extending to another logic blocks will be avoided as much as possible, so that interconnections between scan paths in logic blocks are minimized.

While preferred embodiments of the present invention have been described using specific terms, such description is for illustrative purposes only, and it is to be understood that changes and variations may be made without departing from the spirit or scope of the following claims.

What is claimed is:

1. A method of designing a scan path construction of a test facile semiconductor integrated circuit with scan paths, comprising the steps of:

counting the number of flip-flops to be subjected to a scan path test in each-of logic blocks;

calculating an average number of flip-flops per scan path from the number of scan paths and the overall number of flip-flops in the semiconductor integrated circuit;

reading pin layout information and floor plan information of each of the logic blocks;

assigning scan paths to the logic blocks from a selected logic block serving as a start point;

repeating the step of assigning the scan paths for all combinations of logic blocks; and determining a scan path assigning arrangement in which the overall length of interconnections between the logic blocks is the shortest, based on the results of the assigning the scan paths for all combinations of logic blocks.

2. A method according to claim 1, further including the step of:

assigning residual flip-flops one by one to the scan paths, if a fraction is produced when the average number of flip-flops per scan path is calculated from the number of scan paths and the overall number of flip-flops in the semiconductor integrated circuit.

3. A method according to claim 2, further including the step of:

supplying flip-flops in shortage from the next logic block to satisfy a scan path, if a scan path of an equal length having the average number of flip-flops cannot be constructed in one logic block in said step of assigning a scan path to the logic blocks from a selected logic block serving as a start point.

4. A method according to claim 3, wherein said step of repeating the step of assigning a scan path for all combinations of logic blocks includes the step of repeating the step of assigning a scan path for only combinations of adjacent logic blocks.

5. A method according to claim 3, further including the step of:

constructing a scan path so as not to extend to another plurality of logic blocks as much as possible to determine the shortest expected length of interconnections between the logic blocks, in order to achieve a scan path assigning arrangement to minimize an area of interconnection wiring among the logic blocks.

6. A method according to claim 3, wherein said step of assigning the scan paths includes a step of equalizing divided number of flip-flops within a logic block when the logic block is divided by assigned scan paths.

7. A method according to claim 2, wherein said step of repeating the step of assigning a scan path for all combinations of logic blocks includes the step of repeating the step of assigning a scan path for only combinations of adjacent logic blocks.

8. A method according to claim 2, further including the step of:

constructing a scan path so as not to extend to another plurality of logic blocks as much as possible to determine the shortest expected length of interconnections between the logic blocks, in order to achieve a scan path assigning arrangement to minimize an area of interconnection wiring among the logic blocks.

9. A method according to claim 2, wherein said step of assigning the scan paths includes a step of equalizing divided number of flip-flops within a logic block when the logic block is divided by assigned scan paths.

10. A method according to claim 1, further including the step of:

supplying flip-flops in shortage from the next logic block to satisfy a scan path if a scan path of an equal length having the average number of flip-flops cannot be constructed in one logic block in said step of assigning a scan path to the logic blocks from a selected logic block serving as a start point.

11. A method according to claim 10, wherein said step of repeating the step of assigning a scan path for all combinations of logic blocks includes the step of repeating the step of assigning a scan path for only combinations of adjacent logic blocks.

12. A method according to claim 10, further including the step of:

constructing a scan path so as not to extend to another plurality of logic blocks as much as possible to determine the shortest expected length of interconnections between the logic blocks, in order to achieve a scan path assigning arrangement to minimize an area of interconnection wiring among the logic blocks.

13. A method according to claim 10, wherein said step of assigning the scan paths includes a step of equalizing divided number of flip-flops within a logic block when the logic block is divided by assigned scan paths.

14. A method according to claim 1, wherein said step of repeating the step of assigning a scan path for all combinations of logic blocks includes the step of repeating the step of assigning a scan path for only combinations of adjacent logic blocks.

15. A method according to claim 14, wherein said step of assigning the scan paths includes a step of equalizing divided number of flip-flops within a logic block when the logic block is divided by assigned scan paths.

16. A method according to claim 1, further including the step of:

constructing a scan path so as not to extend to another plurality of logic blocks as much as possible to determine the shortest expected length of interconnections between the logic blocks, in order to achieve a scan path assigning arrangement to minimize an area of interconnection wiring among the logic blocks.

17. A method according to claim 16, wherein said step of assigning the scan paths includes a step of equalizing divided number of flip-flops within a logic block when the logic block is divided by assigned scan paths.

18. A method according to claim 1, wherein said step of assigning the scan paths includes a step of equalizing divided number of flip-flops within a logic block when the logic block is divided by assigned scan paths.

19. An apparatus for designing a scan path construction of a test facile semiconductor integrated circuit with scan paths, comprising:

means for counting the number of flip-flops to be subjected to a scan path test in each of logic blocks;

means for calculating an average number of flip-flops per scan path from the number of scan paths and the overall number of flip-flops in the semiconductor integrated circuit;

means for reading pin layout information and floor plan information of each of the logic blocks;

means for assigning a scan path in a combination of selected logic block serving as a start point and another logic block;

means for repeating the assigning a scan path for all combinations of logic blocks; and means for determining a scan path assigning arrangement in which the overall length of interconnections between the logic blocks the shortest, based on the results of the assigning a scan path for all combinations of logic blocks.

20. A recording medium which stores a control program for a method of designing a scan path construction of a test facile semiconductor integrated circuit with scan paths, wherein said control program comprises the steps of:

counting the number of flip-flops to be subjected to a scan path test in each of logic blocks;

calculating an average number of flip-flops per scan path from the number of scan paths and the overall number of flip-flops in the semiconductor integrated circuit;

reading pin layout information and floor plan information of each of the logic blocks;

assigning a scan path to a selected logic block serving as a start point in each combination with other logic blocks;

repeating the step of assigning a scan path for all combinations of logic blocks; and determining a scan path assigning arrangement in which the overall length of interconnections between the logic blocks is the shortest, based on the results of the assigning of scan paths for all combinations of logic blocks.

* * * * *

UNITED STATES PATENT AND TRADEMARK OFFICE
CERTIFICATE OF CORRECTION

PATENT NO.   : 6,415,404 B1
DATED        : July 2, 2002
INVENTOR(S)  : Asou

It is certified that error appears in the above-identified patent and that said Letters Patent is hereby corrected as shown below:

<u>Column 10,</u>
Line 59, "is shortest" should be -- is the shortest --.

Signed and Sealed this

Fourth Day of November, 2003

JAMES E. ROGAN
*Director of the United States Patent and Trademark Office*